(12) United States Patent
Song et al.

(10) Patent No.: US 11,227,900 B2
(45) Date of Patent: Jan. 18, 2022

(54) DISPLAY DEVICE WITH DUMMY METALLIC PATTERN

(71) Applicant: SAMSUNG DISPLAY CO., LTD., Yongin-si (KR)

(72) Inventors: Sangjune Song, Yongin-si (KR); Jungsik Nam, Yongin-si (KR); Hyeukjoung Song, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 93 days.

(21) Appl. No.: 16/579,068

(22) Filed: Sep. 23, 2019

(65) Prior Publication Data

US 2020/0243618 A1 Jul. 30, 2020

(30) Foreign Application Priority Data

Jan. 30, 2019 (KR) .................. 10-2019-0012137

(51) Int. Cl.
*H01L 27/32* (2006.01)
*H01L 51/52* (2006.01)
*H01L 51/00* (2006.01)

(52) U.S. Cl.
CPC ...... *H01L 27/3223* (2013.01); *H01L 27/3276* (2013.01); *H01L 51/5215* (2013.01); *H01L 51/5253* (2013.01); *H01L 51/0097* (2013.01)

(58) Field of Classification Search
CPC ............. H01L 27/3223; H01L 27/3276; H01L 51/0097

See application file for complete search history.

(56) References Cited

U.S. PATENT DOCUMENTS

| | | | |
|---|---|---|---|
| 9,048,444 B2 | 6/2015 | Kim et al. |
| 9,098,242 B2 | 8/2015 | Rappoport et al. |
| 9,256,250 B2 | 2/2016 | Raff et al. |
| 9,326,375 B2 | 4/2016 | Lee |
| 9,349,969 B2 | 5/2016 | Kwon et al. |
| 9,379,355 B1 | 6/2016 | Lee |
| 9,769,919 B2 | 9/2017 | Park et al. |
| 9,773,853 B2 | 9/2017 | Tao et al. |

(Continued)

FOREIGN PATENT DOCUMENTS

| | | |
|---|---|---|
| KR | 10-2014-0118676 | 10/2014 |
| KR | 10-1736930 | 5/2017 |

(Continued)

OTHER PUBLICATIONS

US 9,224,793 B1, 12/2015, Son et al. (withdrawn)

*Primary Examiner* — Wasiul Haider
(74) *Attorney, Agent, or Firm* — F. Chau & Associates, LLC

(57) ABSTRACT

A display device includes: a substrate including a display area, a peripheral area, a pad area, and a bending area disposed between the display area and the pad area, wherein the peripheral area is disposed outside the display area, and the pad area is disposed in the peripheral area; a plurality of metallic wirings positioned on the substrate and in the bending area; a first organic insulating layer and a second organic insulating layer stacked on the plurality of metallic wirings in the bending area; and a first dummy metallic pattern disposed between the first organic insulating layer and the second organic insulating layer.

18 Claims, 7 Drawing Sheets

(56) References Cited

U.S. PATENT DOCUMENTS

| | | | |
|---|---|---|---|
| 2015/0382446 A1 | 12/2015 | Kwon et al. | |
| 2016/0268519 A1* | 9/2016 | Choi | H01L 51/0094 |
| 2017/0279079 A1* | 9/2017 | Kim | H01L 51/5253 |
| 2017/0287936 A1 | 10/2017 | Kim et al. | |
| 2018/0068621 A1 | 3/2018 | Lee et al. | |
| 2018/0175323 A1 | 6/2018 | Ahn et al. | |
| 2018/0197484 A1 | 7/2018 | Moon et al. | |
| 2019/0129567 A1* | 5/2019 | Rhe | H01L 51/0097 |
| 2020/0212356 A1* | 7/2020 | Kim | H01L 27/3276 |
| 2020/0235329 A1* | 7/2020 | Tian | H01L 21/682 |
| 2021/0036093 A1* | 2/2021 | Okabe | H05B 33/02 |
| 2021/0048919 A1* | 2/2021 | Son | G06F 3/0412 |
| 2021/0066403 A1* | 3/2021 | Wang | H01L 27/3211 |
| 2021/0184139 A1* | 6/2021 | Zhang | H01L 51/0097 |

FOREIGN PATENT DOCUMENTS

| | | |
|---|---|---|
| KR | 10-2017-0115153 | 10/2017 |
| KR | 10-2018-0070784 | 6/2018 |
| KR | 10-1865007 | 6/2018 |
| KR | 10-2018-0082688 | 7/2018 |

\* cited by examiner

DISPLAY DEVICE WITH DUMMY METALLIC PATTERN

CROSS-REFERENCE TO RELATED APPLICATION

This application claims priority under 35 U.S.C. § 119 to Korean Patent Application No. 10-2019-0012137, filed on Jan. 30, 2019, in the Korean Intellectual Property Office, the disclosure of which is incorporated by reference herein in its entirety.

TECHNICAL FIELD

Exemplary embodiments of the present inventive concept relate to a display device, and more particularly, to a display device including a substrate with a bending area including metallic wiring and a dummy metallic pattern.

DISCUSSION OF THE RELATED ART

As display devices have been under rapid development, a variety of flat panel display devices that are relatively slim, relatively light weight, and have relatively low power consumption have been introduced. Recently, a physical button on a front surface of a display device has been removed. Thus, there is a tendency that the area of a display area on the front surface of the display device is increased. In addition, to minimize dead space on the front surface, which is an area in which an image is not displayed, display devices with a display area that is partially bent or a non-display area that is bent have been under development. However, when the non-display area is bent, stress is introduced in a bending area, and any wirings positioned in the bending area are subject to such stress.

SUMMARY

According to an exemplary embodiment of the present inventive concept, a display device includes: a substrate including a display area, a peripheral area, a pad area, and a bending area disposed between the display area and the pad area, wherein the peripheral area is disposed outside the display area, and the pad area is disposed in the peripheral area; a plurality of metallic wirings positioned on the substrate and in the bending area; a first organic insulating layer and a second organic insulating layer stacked on the plurality of metallic wirings in the bending area; and a first dummy metallic pattern disposed between the first organic insulating layer and the second organic insulating layer.

In an exemplary embodiment of the present inventive concept, a thin-film transistor and a light-emitting device electrically connected to the thin-film transistor are positioned in the display area of the substrate, and the first organic insulating layer is positioned between the thin-film transistor and the light-emitting device in the display area.

In an exemplary embodiment of the present inventive concept, the thin-film transistor includes an active layer, a gate electrode, a source electrode, and a drain electrode, and the plurality of metallic wirings include a same material as the source electrode and the drain electrode.

In an exemplary embodiment of the present inventive concept, the light-emitting device includes a pixel electrode electrically connected to the thin-film transistor, a common electrode disposed on the pixel electrode; and an intermediate layer disposed between the pixel electrode and the common electrode, and wherein the first dummy metallic pattern includes a same material as the pixel electrode.

In an exemplary embodiment of the present inventive concept, the pixel electrode has a stack structure including a first conductive layer, a second conductive layer and a third conductive layer, wherein the first conductive layer includes a transparent or semitransparent electrode layer, wherein the second conductive layer includes silver, wherein the third conductive layer includes a transparent or semitransparent electrode layer, and wherein the first dummy metallic pattern includes a same material as the second conductive layer.

In an exemplary embodiment of the present inventive concept, in the display area, the second organic insulating layer includes an opening covering edges of the pixel electrode and exposing a central portion of the pixel electrode, and wherein the intermediate layer is positioned on the pixel electrode in the opening.

In an exemplary embodiment of the present inventive concept, the display device further includes a bending protection layer disposed on the second organic insulating layer, wherein the bending protection layer provides a stress neutral plane, in the bending area, for the plurality of metallic wirings.

In an exemplary embodiment of the present inventive concept, the display device further includes a second dummy metallic pattern disposed between the second organic insulating layer and the bending protection layer.

In an exemplary embodiment of the present inventive concept, the display device further includes a third dummy metallic pattern disposed on the bending protection layer.

In an exemplary embodiment of the present inventive concept, the first dummy metallic pattern extends along the bending area and includes a plurality of holes.

In an exemplary embodiment of the present inventive concept, an inorganic insulating layer is stacked on the display area and the peripheral area of the substrate, and the bending area includes an open area and a dummy insulating pattern including an organic material positioned in the open area, wherein the open area exposes a top surface of the substrate.

In an exemplary embodiment of the present inventive concept, the plurality of metallic wirings are positioned on the dummy insulating pattern.

According to an exemplary embodiment of the present inventive concept, a display device including: a substrate including a display area, a peripheral area, a pad area, and a bending area disposed between the display area and the pad area, wherein the peripheral area is disposed outside the display area, and the pad area is disposed in the peripheral area; a thin-film transistor disposed in the display area of the substrate; a light-emitting device electrically connected to the thin-film transistor; a first organic insulating layer disposed between the thin-film transistor and the light-emitting device; a second organic insulating layer disposed on the first organic insulating layer and providing an emission area of the light-emitting device; and a plurality of metallic wirings positioned on the substrate and in the bending area disposed between the display area and the pad area, wherein the first organic insulating layer, the second organic insulating layer, and the plurality of metallic wirings are stacked in the bending area, and a first dummy metallic pattern is positioned between the first organic insulating layer and the second organic insulating layer.

In an exemplary embodiment of the present inventive concept, the first dummy metallic pattern overlaps the plurality of metallic wirings.

In an exemplary embodiment of the present inventive concept, a first portion of the first organic insulating layer disposed in the bending area is separated from a second portion of the first organic insulating layer disposed in the display area.

In an exemplary embodiment of the present inventive concept, the first dummy metallic pattern includes a plurality of holes.

In an exemplary embodiment of the present inventive concept, the light-emitting device includes a pixel electrode electrically connected to the thin-film transistor, wherein the pixel electrode has a stack structure including a first conductive layer, a second conductive layer and a third conductive layer, wherein the first conductive layer includes a transparent or semitransparent electrode layer, wherein the second conductive layer includes silver, wherein the third conductive layer includes a transparent or semitransparent electrode layer, and wherein the first dummy metallic pattern includes a same material as the second conductive layer.

In an exemplary embodiment of the present inventive concept, the display device further includes a bending protection layer disposed on the second organic insulating layer in the bending area, wherein the bending protection layer provides a stress neutral plane in the bending area.

In an exemplary embodiment of the present inventive concept, the display device further includes a second dummy metallic pattern disposed between the second organic insulating layer and the bending protection layer.

In an exemplary embodiment of the present inventive concept, the display device further includes a third dummy metallic pattern disposed on the bending protection layer in the bending area.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION

Figure 1:
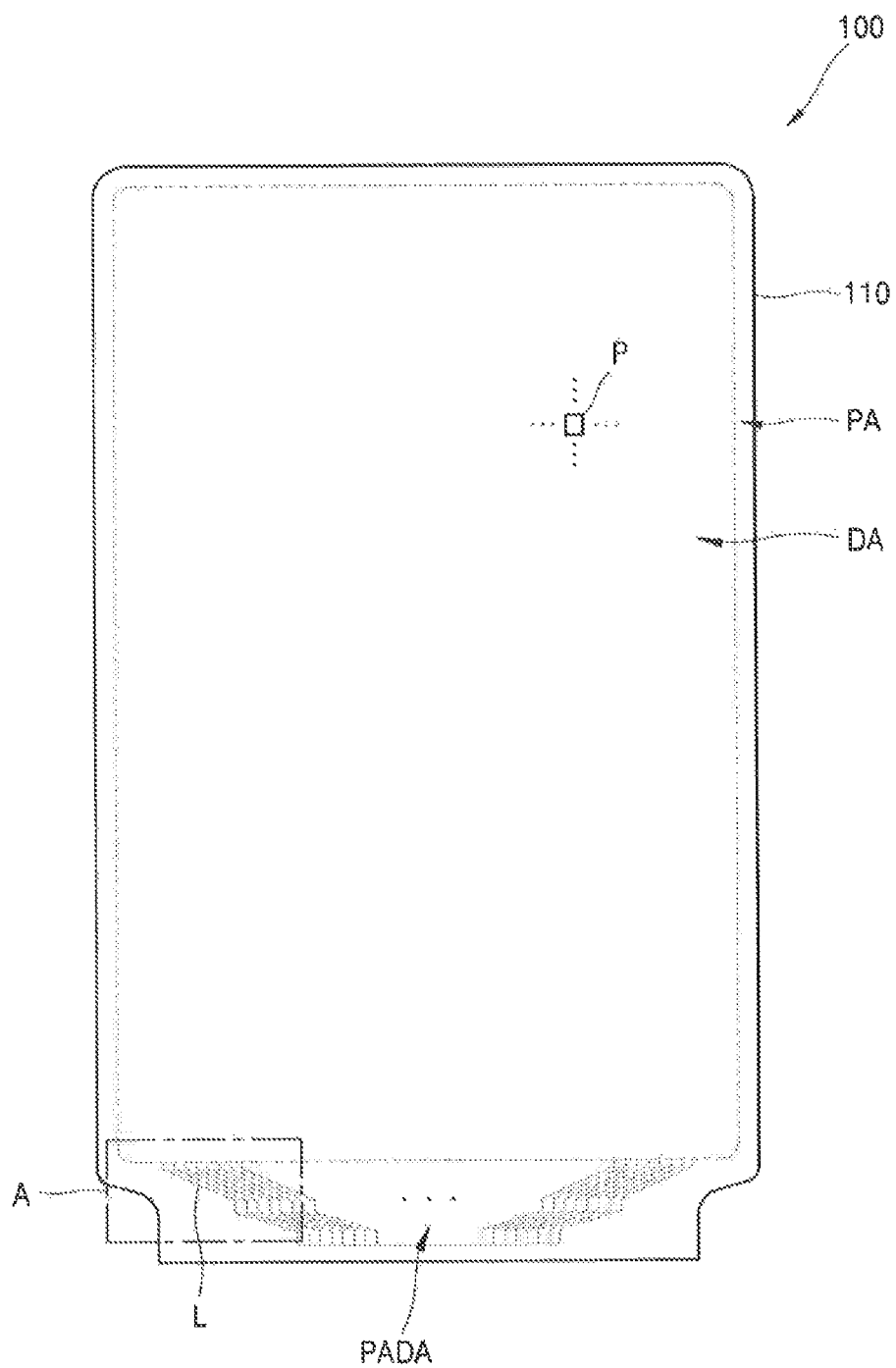
FIG. 1 is a plan view schematically illustrating a display device according to an exemplary embodiment of the present inventive concept.

Exemplary embodiments of the present inventive concept will now be described more fully with reference to the accompanying drawings. It is to be understood that the present inventive concept may be embodied in different forms and thus should not be construed as being limited to the exemplary embodiments set forth herein. It is to be understood that like reference numerals may refer to like elements throughout the specification, and thus redundant descriptions may be omitted.

It will be understood that although the terms "first", "second", etc. may be used herein to describe various components, these components should not be limited by these terms. These components are only used to distinguish one component from another component. Thus, a first component discussed below could be termed a second component without departing from the spirit and scope of the present inventive concept.

It will be understood that when a layer, region, or component is referred to as being "on" another layer, region, or component, the layer, region or component can be directly on another layer, region, or component or intervening layers, regions, or components may be present.

Sizes of elements in the drawings may be exaggerated for clarity. In other words, since sizes and thicknesses of components in the drawings may be exaggerated for clarity, the following exemplary embodiments of the present inventive concept are not limited thereto.

When an exemplary embodiment of the present inventive concept may be implemented differently, a process order may be performed differently from the described order. For example, two consecutively described processes may be performed at substantially the same time or performed in an order opposite to the described order.

Hereinafter, exemplary embodiments of the present inventive concept will be described below in more detail with reference to the accompanying drawings.

Figure 2:
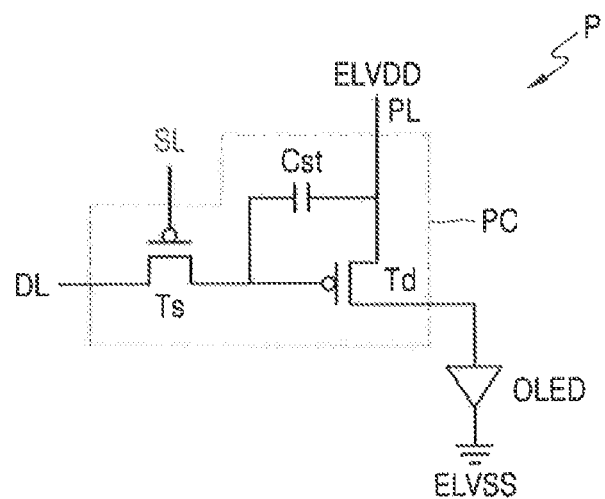
FIG. 2 is a circuit diagram of one (sub-)pixel of the display device of FIG. 1.

FIG. 1 is a plan view schematically illustrating a display device according to an exemplary embodiment of the present inventive concept, and FIG. 2 is a circuit diagram of one (sub-)pixel of the display device of FIG. 1.

Referring to FIG. 1, a display device 100, according to an exemplary embodiment of the present inventive concept, includes a substrate 110 including a display area DA, in which an image is displayed, and a peripheral area PA outside the display area DA. For example, the peripheral area PA may at least partially surround the display area DA and might not display an image.

A plurality of (sub-)pixels P are positioned in the display area DA. FIG. 2 illustrates an example of a circuit diagram of one (sub-)pixel P. Referring to FIG. 2, a (sub-)pixel P may include a pixel circuit PC connected to a scan line SL and a data line DL and a light-emitting device connected to the pixel circuit PC. The light-emitting device may include an organic light-emitting device (OLED), for example.

The pixel circuit PC may include a driving thin-film transistor (TFT) Td, a switching TFT Ts, and a storage capacitor Cst. The switching TFT Ts may be connected to the scan line SL and the data line DL and may transmit a data signal input through the data line DL to the driving TFT Td according to a scan signal input through the scan line SL. The storage capacitor Cst may be connected to the switching TFT Ts and a driving voltage line PL and may store a voltage that corresponds to a difference between a voltage transmitted from the switching TFT Ts and a driving voltage ELVDD supplied to the driving voltage line PL.

The driving TFT Td may be connected to the driving voltage line PL and the storage capacitor Cst, and the driving TFT Td may control a driving current that flows through the OLED from the driving voltage line PL in response to a voltage value stored in the storage capacitor Cst. The OLED may emit light having a certain brightness due to the driving current. The OLED may emit red, green, blue, or white light, for example.

In FIG. 2, one (sub-)pixel includes two TFTs and one storage capacitor. However, exemplary embodiments of the present inventive concept are not limited thereto. For example, the pixel circuit PC of the (sub-)pixel P may be variously modified by including three or more TFTs and/or two or more storage capacitors.

Referring back to FIG. 1, the peripheral area PA on the substrate 110 may surround the display area DA. The peripheral area PA may be an area in which no pixels are positioned and may include a pad area PADA that is an area into which various electronic devices or printed circuit boards (PCBs) are electrically attached to. For example, the pad area PADA may be adjacent an edge of the substrate 110. A plurality of wirings L that supply power for driving the light-emitting device or that transmit an electrical signal may be positioned in the peripheral area PA. For example, the plurality of wirings L may be positioned between the pad area PADA and the display area DA, may be connected to the data line DL or the scan line SL in the display area DA, may transmit a data signal or scan signal to the display area DA from a driving circuit attached to the pad area PADA, or may supply power for driving the light-emitting device.

FIG. 1 may also be understood as a plan view illustrating the substrate 110 during a manufacturing process of the display device 100. In an electronic device such as a manufactured display device 100 or a smartphone including the display device 100, a part of the substrate 110 may be bent to minimize the area of the peripheral area PA recognized by a user.

Figure 3:
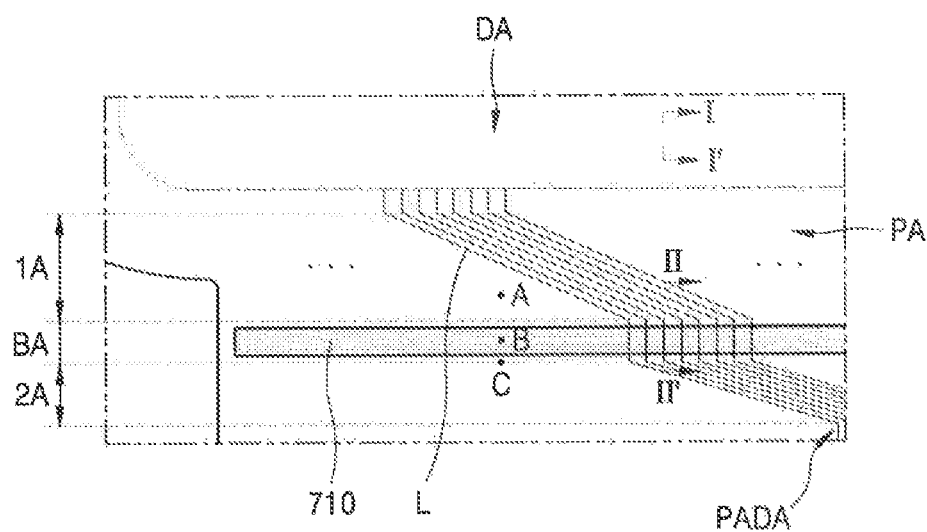
FIG. 3 is a plan view schematically illustrating a region A of FIG. 1.
Figure 4:
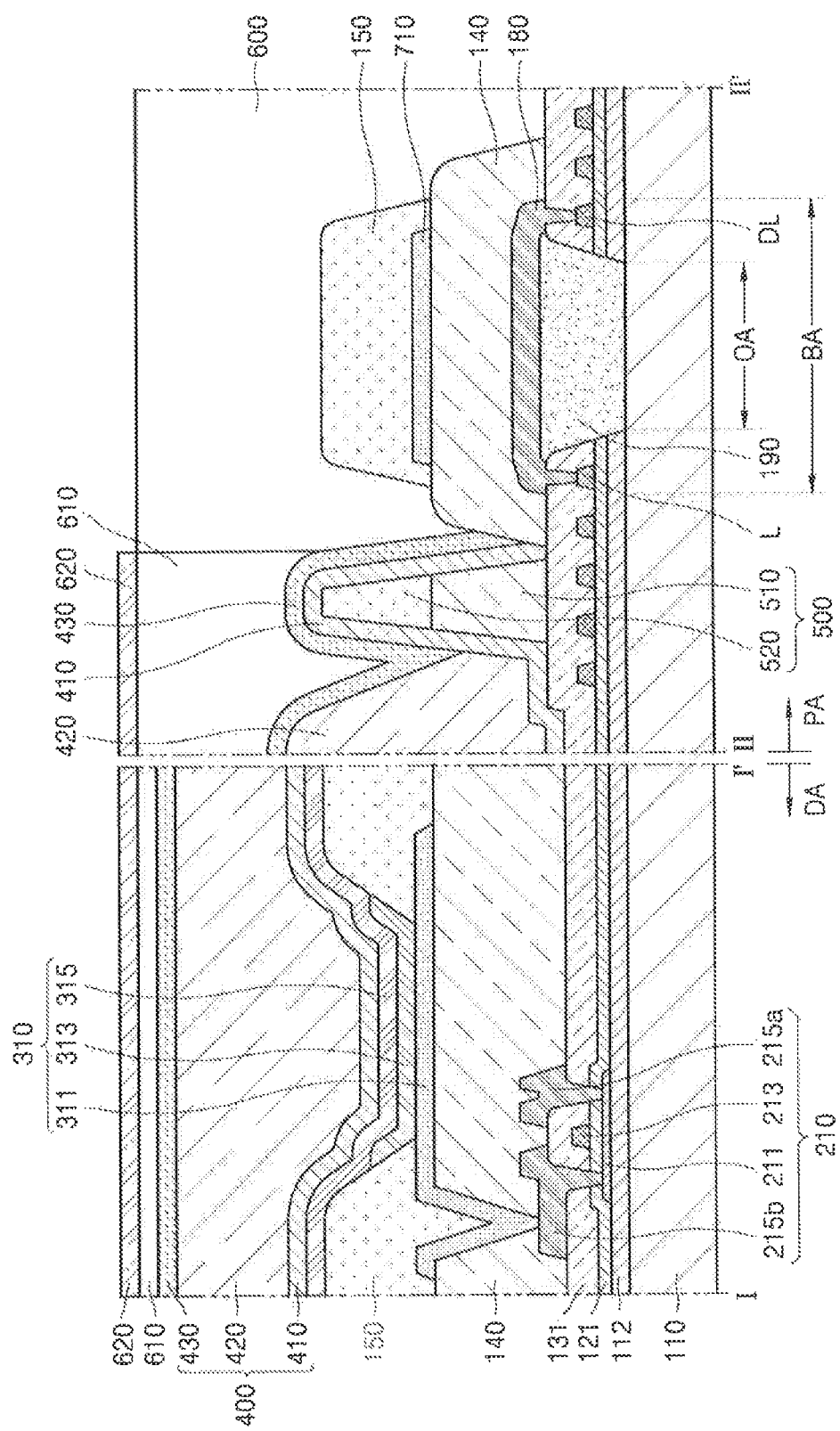
FIG. 4 is a cross-sectional view taken along a line I-I' and along a line II-II' of FIG. 3 according to an exemplary embodiment of the present inventive concept.
Figure 5:
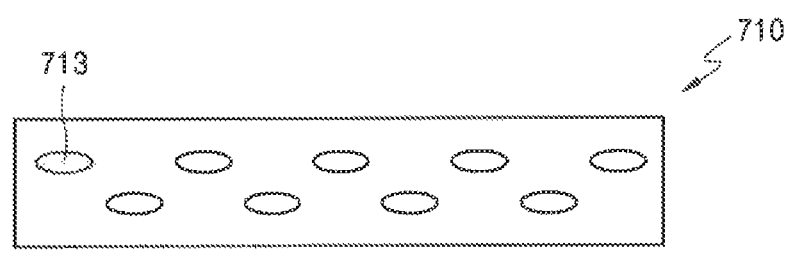
FIG. 5 is a plan view schematically illustrating dummy metallic patterns of FIG. 3.

FIG. 3 is a plan view schematically illustrating a region A of FIG. 1, FIG. 4 is a cross-sectional view taken along a line I-I' and along a line II-II' of FIG. 3 according to an exemplary embodiment of the present inventive concept, and FIG. 5 is a plan view schematically illustrating dummy metallic patterns of FIG. 3.

As described above, a part of the substrate 110 may be bent to minimize the area of the peripheral area PA, For example, as shown in FIG. 3, the peripheral area PA may include a bending area BA disposed between the pad area PADA and the display area DA, and the substrate 110 may be bent in the bending area BA so that at least a part of the pad area PADA may overlap the display area DA. For example, a bending direction is set so that the pad area PADA does not cover a front surface the display area DA such that a displayed image may not be blocked. The pad area PADA is positioned behind the display area DA. Thus, the user may recognize that the display area DA takes the greater part of the display device 100.

The substrate 110 may include various flexible or bendable materials. For example, the substrate 110 may include polymer resin, such as polyethersulphone (PES), polyacrylate (PAR), polyetherimide (PEI), polyethylene napthalate (PEN), polyethylene terephthalate (PET), polyphenylene sulfide (PPS), polyarylate (PAR), polyimide (PI), polycarbonate (PC) or cellulose acetate propionate (CAP). For example, the substrate 110 may be variously modified like. For example, the substrate 110 may have a multi-layer structure including two layers including polymer resin and a barrier layer including an inorganic material (e.g., silicon oxide, silicon nitride, or silicon oxynitride) between the two layers. In an exemplary embodiment of the present inventive concept, a substrate 110 of a display in which the substrate 110 is not bent, may include glass.

Hereinafter, one (sub-)pixel structure will be described in detail with reference to FIG. 4.

Referring to FIG. 4, in the display area DA, a TFT 210, a light-emitting device 310 and a first organic insulating layer 140 may be positioned on the substrate 110. For example, the light-emitting device 310 may be electrically connected to the TFT 210, and the first organic insulating layer 140 may be disposed between the TFT 210 and the light-emitting device 310. For example, the light-emitting device 310 may be an OLED, and the TFT 210 may correspond to the driving TFT (see Td of FIG. 2) of the pixel circuit PC described with reference to FIG. 2. FIG. 4 illustrates only one TFT 210 in the pixel circuit PC for clarity. However, the switching TFT (see Ts of FIG. 2) and the storage capacitor (see Cst of FIG. 2) described with reference to FIG. 2 are included in the pixel circuit PC, as described above.

A buffer layer 112 may be positioned on the substrate 110. The buffer layer 112 may provide a flat surface to an upper portion of the substrate 110 and may prevent foreign substances from penetrating into the substrate 110 and other components of the display device 100. For example, the buffer layer 112 may include an inorganic material, such as silicon oxide, silicon nitride, silicon oxynitride, aluminum oxide, aluminum nitride, titanium oxide or titanium nitride, and/or an organic material, such as polyimide, polyester or acryl, and may have a shape of a plurality of stacked structures formed of the materials.

The TFT 210 may include an active layer 211, a gate electrode 213, a source electrode 215a, and a drain electrode 215b. For example, hereinafter, the TFT 210 is of a top gate type in which the active layer 211, the gate electrode 213, the source electrode 215a, and the drain electrode 215b are sequentially formed, and the gate electrode 213 is formed above the active layer 211, the source electrode 215a, and the drain electrode 215b. However, exemplary embodiments of the present inventive concept are not limited thereto. For example, the TFT 210 may be of a variety of types, such as a bottom gate type, etc.

The active layer 211 may include a semiconductor material such as amorphous silicon or polycrystalline silicon. However, exemplary embodiments of the present inventive concept are not limited thereto. For example, the active layer 211 may include various materials. In an exemplary embodiment of the present inventive concept, the active layer 211 may include an organic semiconductor material. In an exemplary embodiment of the present inventive concept, the active layer 211 may include an oxide semiconductor material. For example, the active layer 211 may include Group 12, 13, and 14 elements, such as zinc (Zn), indium (In), gallium (Ga), tin (Sn), cadmium (Cd), and germanium (Ge), and an oxide of a material selected from a combination thereof.

The gate insulating layer 121 is formed on the active layer 211. The gate insulating layer 121 may have a multi-layer or single layer structure including a layer formed of an inorganic material such as silicon oxide and/or silicon nitride. The gate insulating layer 121 may insulate between the active layer 211 and the gate electrode 213. The gate insulating layer 121 may extend through the peripheral area PA and the display area DA.

The gate electrode 213 is formed on the gate insulating layer 121. The gate electrode 213 may be connected to a gate line for applying an on/off signal to the TFT 210. The gate electrode 213 may include a low resistance metallic material. For example, the gate electrode 213 may have a single layer or multi-layer structure including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

An interlayer insulating layer 131 is formed on the gate electrode 213. The interlayer insulating layer 131 insulates between the source electrode 215a and the drain electrode 215b and the gate electrode 213. The interlayer insulating layer 131 may extend through the peripheral area PA and the display area DA. The interlayer insulating layer 131 may have a single layer or multi-layer structure including a layer formed of an inorganic material. For example, the inorganic material may be a metal oxide or metal nitride. For example, the inorganic material may include silicon oxide ($SiO_2$), silicon nitride ($SiN_x$), silicon oxynitride ($SiO_N$), aluminum oxide ($Al_2O_3$), titanium oxide ($TiO_2$), tantalum oxide ($Ta_2O_5$), hafnium oxide ($HfO_2$), and/or zinc oxide ($ZrO_2$).

The source electrode 215a and the drain electrode 215b may be formed on the interlayer insulating layer 131. The source electrode 215a and the drain electrode 215b are each formed to be in contact with an area of the active layer 211. The source electrode 215a and the drain electrode 215b may have a single layer or multi-layer structure including Al, Pt, Pd, Ag, Mg, Au, Ni, Nd, Ir, Cr, Li, Ca, Mo, Ti, W, and/or Cu. For example, the source electrode 215a and the drain electrode 215b may be a three-layer stack structure of Ti, Al, and Ti.

A first organic insulating layer 140 is formed on the source electrode 215a and the drain electrode 215b. The first organic insulating layer 140 eliminates a step difference (e.g., a difference in height) caused by the TFT 210 and may prevent defects from occurring in the light-emitting device 310 due to unevenness in heights of layers disposed below the light emitting device 310. The first organic insulating layer 140 may have a single layer or multi-layer structure including a layer formed of an organic material. The organic material may include a polymer such as polymethylmethacrylate (PMMA) or polystyrene (PS), a polymer derivative having a phenol-based group, acryl-based polymer, imide-based polymer, arylether-based polymer, amide-based polymer, fluorine-based polymer, p-xylene-based polymer, vinyl alcohol-based polymer, and a blend thereof.

The light-emitting device 310 may be positioned on the first organic insulating layer 140. The light-emitting device 310 including a pixel electrode 311, a common electrode 315, and an intermediate layer 313 disposed between the pixel electrode 311 and the common electrode 315. The intermediate layer 313 may include an emission layer. For example, the light-emitting device 310 may be an OLED.

The pixel electrode 311 may be positioned on the first organic insulating layer 140 and may be electrically connected to the TFT 210 disposed thereunder via a contact hole formed in the first organic insulating layer 140. The pixel electrode 311 may have various shapes such as a polygonal shape. For example, the pixel electrode 311 may be patterned to be separated from other elements by using a photolithography method.

The pixel electrode 311 may include a reflective electrode, for example. For example, the pixel electrode 311 may include a reflective layer formed of Ag, Mg, Al, Pt, Pd, Au, Ni, Nd, Ir, Cr, and a compound thereof and/or a transparent or semitransparent electrode layer formed on the reflective layer. The transparent or semitransparent electrode layer may include indium tin oxide (ITO), indium zinc oxide (IZO), indium tin zinc oxide (ITZO), gallium zinc oxide (GZO), and/or indium gallium zinc oxide (IGZO).

In an example, the pixel electrode 311 may have a stack structure of a first conductive layer including a transparent or semitransparent electrode layer, a second conductive layer including Ag, and a third conductive layer including a transparent or semitransparent electrode layer. In addition, the second conductive layer including Ag may further include an alloy element having an atom radius the same as or smaller than the atom radius of Ag to prevent agglomeration of Ag. The alloy element may include Zn, Ni, cobalt (Co), Cu, Ga, Ge, Pt, antimony (Sb), manganese (Mn), W, and/or Mo.

A second organic insulating layer 150 is formed on the first organic insulating layer 140. For example, the second organic insulating layer 150 covers edges of the pixel electrode 311. The second organic insulating layer 150 has an opening corresponding to each pixel, e.g., an opening through which at least the central part of the pixel electrode 311 is exposed, thereby forming a pixel. In addition, the second organic insulating layer 150 increases a distance between edges of the pixel electrode 311 and the common electrode 315, thereby preventing an arc from occurring therebetween. The second organic insulating layer 150 may be formed of one or more organic insulating materials such as polyimide, polyimide, acryl resin, benzocyclobutene, and/or a phenol resin using a method such as spin coating.

The intermediate layer 313 may be formed on the pixel electrode 311 and may be exposed by the opening of the second organic insulating layer 150. The intermediate layer 313 may include a small molecular weight material or polymer material. When the intermediate layer 313 includes a small molecular weight material, the intermediate layer 313 may have a structure in which a hole injection layer (HIL), a hole transport layer (HTL), an emission layer (EML), an electron transport layer (ETL) and an electron injection layer (EIL) are stacked in a single or composite structure, and may include various organic materials, such as copper phthalocyanine (CuPc), N,N'-Di(naphthalene-1-yl)-N,N'-diphenyl-benzidine (NPB), and tris-8-hydroxyquinoline aluminum) (Alq3). For example, these layers may be formed by vacuum deposition.

When the intermediate layer 313 includes a polymer material, the intermediate layer 313 may have a structure including an HTL and an EML. In this case, the HTL may include PEDOT, and the emission layer may include a polymer material such as a Poly-Phenylenevinylene (PPV)-based polymer material and a polyfluorene-based polymer material. The structure of the intermediate layer 313 is not limited to the above description, and the intermediate layer 313 may have various structures. For example, the intermediate layer 313 may include a layer integrally formed in a plurality of pixel electrodes 311 or a layer patterned to correspond to each of the plurality of pixel electrodes 311.

The common electrode 315 may be positioned to cover the display area DA. For example, the common electrode 315 may be integrally formed to cover a plurality of light-emitting devices 310. The common electrode 315 may include a transparent or semitransparent electrode and may include a metallic thin layer having a small work function including Li, Ca, LiF/Ca, LiF/Al, Al, Ag, Mg, and a compound thereof. In addition, an auxiliary electrode layer or bus electrode may be further formed on the metallic thin layer using a material for forming a transparent electrode, such as ITO, IZO, ZnO or $In_2O_3$. Thus, light emitted from an organic emission layer included in the intermediate layer 313 may be transmitted through the common electrode 315. For example, the light emitted from the organic emission layer may be emitted toward the common electrode 315 or reflected by the pixel electrode 311 that may be a reflective electrode. The light reflected by the pixel electrode 311 may be emitted toward the common electrode 315.

In addition, the display device 100 according to the present embodiment is not limited to a top emission type and may also be of a bottom emission type in which light emitted from the organic emission layer is emitted toward the substrate 110. In this case, the pixel electrode 311 may include a transparent or semitransparent electrode, and the common electrode 315 may include a reflective electrode. In addition, the display device 100 according to the present embodiment may be of a double emission type in which light is emitted in both directions including forward and backward directions.

An encapsulation layer 400 is positioned on the common electrode 315. The encapsulation layer 400 may protect the light-emitting device 310 from moisture or oxygen from outside. The encapsulation layer 400 may extend in the peripheral area PA outside the display area DA and in the display area DA in which the light-emitting device 310 is positioned. The encapsulation layer 400 may have a multi-layer structure, as shown in FIG. 4. For example, the encapsulation layer 400 may include a first inorganic encapsulation layer 410, an organic encapsulation layer 420, and a second inorganic encapsulation layer 430, which are sequentially stacked on one another.

The first inorganic encapsulation layer 410 may be formed on the common electrode 315 and may include, for example, silicon oxide, silicon nitride and/or silicon oxynitride. The first inorganic encapsulation layer 410 may be formed along a structure, such as the common electrode 315.

The organic encapsulation layer 420 may be positioned on the first inorganic encapsulation layer 410 and may have a predetermined thickness, and the top surface of the organic encapsulation layer 420 may be substantially flat. For example, the organic encapsulation layer 420 may have a thickness greater than that of the first inorganic encapsulation layer 410. The organic encapsulation layer 420 may include polyethylene terephthalate, polyethylene naphthalate, polycarbonate, polyimide, polyethylene sulfonate, polyoxymethylene, polyacrylate, and/or hexamethyldisiloxane.

The second inorganic encapsulation layer 430 may cover the organic encapsulation layer 420 and may include, for example, silicon oxide, silicon nitride and/or silicon oxynitride. The first inorganic encapsulation layer 410 and the second inorganic encapsulation layer 430 may have a larger area than the organic encapsulation layer 420 and may be in direct contact with the organic encapsulation layer 420. For example, the organic encapsulation layer 420 may not be exposed to the outside due to the first inorganic encapsulation layer 410 and the second inorganic encapsulation layer 430.

In this way, the encapsulation layer 400 includes the first inorganic encapsulation layer 410, the organic encapsulation layer 420, and the second inorganic encapsulation layer 430. Thus, even when cracks occur in the encapsulation layer 400, due to such a multi-layer structure, these cracks may not occur between the first inorganic encapsulation layer 410 and the organic encapsulation layer 420 or between the organic encapsulation layer 420 and the second inorganic encapsulation layer 430. In other words, cracks may not completely penetrate the encapsulation layer 400. Thus, formation of a path in which moisture or oxygen from the outside may penetrate into the display area DA may be prevented or minimized.

For example, when the organic encapsulation layer 420 is formed, a material for forming the organic encapsulation layer 420 may be limited to being positioned in a predetermined area. To this end, a dam portion 500 may be positioned in the peripheral area PA, as shown in FIG. 4. The dam portion 500 is positioned in the peripheral area PA to be separate from the first organic insulating layer 140.

The dam portion 500 may have a multi-layer structure. In an example, the dam portion 500 may have a structure in which a first layer 510 and a second layer 520 are stacked. The first layer 510 may be formed of the same material as the first organic insulating layer 140 and may be formed simultaneously with the formation of the first organic insulating layer 140. The second layer 520 may be formed of the same material as the second organic insulating layer 150 and may be formed simultaneously with the formation of the second organic insulating layer 150. However, exemplary embodiments of the present inventive concept are not limited thereto. For example, the dam portion 500 may further include a third layer including the same material as the second organic insulating layer 150 and may be formed on the second layer 520. In addition, two or more dam portions 500 may be formed separate from each other. When two or more dam portions 500 are formed, the height of each dam portion 500 may increase toward edges of the substrate 110. For example, the dam portion 500 nearest the edge of the substrate 110 may have the greatest height in comparison to the other dam portions 500 disposed on the substrate 110.

The dam portion 500 may prevent a material for forming the organic encapsulation layer 420 from moving in a direction toward the edges of the substrate 110 when the organic encapsulation layer 420 is formed on the first inorganic encapsulation layer 410. In addition, the dam portion 500 is separate from the first organic insulating layer 140 so that moisture from the outside of the display device 100 may be prevented from penetrating into the display area DA along the first organic insulating layer 140 formed of an organic material.

In addition, the first inorganic encapsulation layer 410 and the second inorganic encapsulation layer 430 of the encapsulation layer 400 may cover the dam portion 500, extend beyond the dam portion 500 toward the edge of the substrate 110 and may be in contact with the dam portion 500 so that penetration of external moisture and oxygen may be prevented.

As shown in FIG. 4, a polarization plate 620 may be attached to the encapsulation layer 400 by using an optically clear adhesive (OCA) 610. In this case, when the first organic insulating layer 140 and the dam portion 500 in the display area DA are physically separated from each other, the OCA 610 may fill between the first organic insulating layer 140 and the dam portion 500.

The polarization plate 620 may reduce external light reflection. For example, when external light passes through the polarization plate 620, the external is reflected on the top surface of the common electrode 315, and then the reflected light passes through the polarization plate 620. In this case, the external light passes through the polarization plate 620 twice so that the phase of the external light may be changed.

As a result, the phase of the reflected light is different from the phase of the external light that enters into the polarization plate 620 so that extinction interference may occur, and thus, external light reflection may be reduced and visibility may be increased. The OCA 610 and the polarization plate 620 may be positioned to cover a valley or gap between the first organic insulating layer 140 and the dam portion 500, as shown in FIG. 4, for example.

Referring back to FIG. 3, wirings L disposed between the pad area PADA and the display area DA may supply power for driving the light-emitting device 310 to the display area DA or may be connected to a data line or scan line within the display area DA and may transmit a data signal or scan signal to the display area DA from a driving circuit attached to the pad area PADA. These wirings L may be positioned on the same layer as a layer on which the gate electrode 213 is positioned, or may be positioned on the same layer as a layer on which the source electrode 215a and the drain electrode 215b are positioned.

In an example, as shown in FIG. 4, when the wirings L are positioned on the same layer as the layer on which the gate electrode 213 is positioned, the wirings L may be divided in the bending area BA. For example, the wirings L may be formed in a first area 1A between the display area DA and the bending area BA, and the wirings L may be formed in a second area 2A between the bending area BA and the pad area PADA. The wirings L disposed in the first area 1A may be connected to the wirings L disposed in the second area 2A via a metallic wiring 180 having a bridge shape in the bending area BA, as shown in FIG. 3. The metallic wiring 180 may be positioned on dummy insulating patterns 190 that will be described later and may be formed together with a source electrode 215a and a drain electrode 215b. For example, the wirings L disposed in the first area 1A may be separated from the wirings L disposed in the second area 2A by a space, and the metallic wiring 180 may connect the wirings L disposed in the first area 1A to the wirings L disposed in the second area 2A by crossing that space. In contrast, when the wirings L are formed on the same layer as a layer on which the source electrode 215a and the drain electrode 215b are positioned, the wirings L may be positioned on the dummy insulating patterns 190 and thus may be integrally formed between the display area PA and the pad area PADA. For example, the metallic wiring 180 disposed on the dummy insulating patterns 190 is not limited to a wiring having a bridge shape illustrated in FIG. 4.

The bending area BA is disposed between the display area DA and the pad area PADA and includes an open area OA in which the top surface of the substrate 110 is exposed, as shown in FIG. 4. The open area OA is an area in which the buffer layer 112, the gate insulating layer 121, and the interlayer insulating layer 131 on the substrate 110 are partially removed. The open area OA may facilitate bending in the bending area BA and may prevent cracks from occurring in an inorganic insulating layer during bending.

An organic material may fill the open area OA. The organic material filled in the open area OA in this way may be dummy insulating patterns 190. The dummy insulating patterns 190 may extend to a non-bending area adjacent to the bending area BA based on the positioning of the bending area BA. The dummy insulating patterns 190 may compensate for a step difference in the open area OA and may absorb stress generated by bending. Thus, concentration of stress that occurs in various metallic wirings 180 in the bending area BA during bending may be minimized to transmit electrical signals to the display area DA from a pad portion including conductive pads in the pad area PADA.

The dummy insulating patterns 190 may include acryl, metacrylic, polyester, polyethylene, polypropylene, polyethylene terephthalate, polyethylene naphthalate, polycarbonate, polyimide, polyethylene sulphonate, polyoxymethylene, polyacrylate, and/or hexamethyldisiloxane.

The first organic insulating layer 140 and the second organic insulating layer 150 may be positioned in the bending area BA. In addition, a bending protection layer 600 may be positioned on the second organic insulating layer 150 in the bending area BA. The bending protection layer 600 may provide a stress neutral plane, during bending, near the metallic wiring 180 in the bending area BA. If the bending protection layer 600 is not present, excessive tensile stress may be applied to the metallic wiring 180 on the substrate 110 within the bending area BA according to bending of the substrate 110. This excessive tensile stress applied to the metallic wiring 180 is because the position of wiring in the bending area BA may not correspond to the stress neutral plane. However, according to an exemplary embodiment of the present inventive concept, the bending protection layer 600 is present, and the thickness and modulus thereof are adjusted so that the position of the stress neutral plane in a stack structure, which includes the substrate 110, the metallic wiring 180, and the bending protection layer 600 in the bending area BA, may be adjusted. Thus, the stress neutral plane may be positioned near the metallic wiring 180 in the bending area BA by using the bending protection layer 600 so that stress applied to the metallic wiring 180 in the bending area BA may be minimized.

The above-described display device (see 100 of FIG. 1) may be bent in the bending area BA and may be included in electronic equipment, etc. In this case, stress due to bending remains in the bending area BA. In this state, when external shock is applied to the display device (see 100 of FIG. 1) or electronic equipment during a process of manufacturing the display device (see 100 of FIG. 1) or during the use of the electronic equipment, damage may occur in the metallic wiring 180 in the bending area BA in which the stress remains.

To prevent the metallic wiring 180 from being damaged, the display device (see 100 of FIG. 1) may include a first dummy metallic pattern 710 disposed between the first organic insulating layer 140 and the second organic insulating layer 150 in the bending area BA. In an example, the first dummy metallic pattern 710 may be formed of the same material as the pixel electrode 311 and may be formed simultaneously with the pixel electrode 311. In an example, when the pixel electrode 311 has a stack structure of a first conductive layer including a transparent or semitransparent electrode layer, a second conductive layer including Ag, and a third conductive layer including a transparent or semi-transparent electrode layer, the first dummy metallic pattern 710 may be formed together with the second conductive layer of the pixel electrode 311 and may include the same material as the second conductive layer. Thus, a manufacturing process of the display device (see 100 of FIG. 1) may be simplified compared to a manufacturing process of a display device according to the related art further including an additional cover member for covering the bending area BA or a buffer layer under the bending area BA to protect the metallic wiring 180 in the bending area BA.

The first dummy metallic pattern 710 may prevent external shock from being transferred to the metallic wiring 180 in the bending area BA and may prevent the metallic wiring 180 in the bending area BA from being damaged due to shock. To this end, the first dummy metallic pattern 710 may extend along the bending area BA and may have a similar width to that of the bending area BA, as shown in FIG. 3.

In addition, because the first dummy metallic pattern 710 is positioned on the metallic wiring 180 in the bending area BA, when external shock is applied to the first dummy metallic pattern 710, the first dummy metallic pattern 710 may absorb shock, and cracks may occur in the first dummy metallic pattern 710. Thus, the metallic wiring 180 in the bending area BA thereunder may be prevented from being damaged. For example, the first dummy metallic pattern 710 may function at least as a shock absorption layer.

In addition, as the first dummy metallic pattern 710 is positioned in the bending area BA, the thickness of the bending protection layer 600 for allowing the stress neutral plane during bending to be positioned near the metallic wiring 180 in the bending area BA may be reduced. Thus, the thickness of the display device (see 100 of FIG. 1) in the bending area BA may be reduced. The first dummy metallic pattern 710 may be in a floating state.

In addition, as the first dummy metallic pattern 710 is positioned in the bending area BA, stress that occurs in the bending area BA may be reduced. This will be described later with reference to FIGS. 6 through 8.

The first dummy metallic pattern 710 may further include a plurality of holes 713, as shown in FIG. 5. The plurality of holes 713 may be formed in a plurality of rows, and the plurality of rows of the holes 713 may be misaligned with each other. In this way, when the holes 713 are formed in the first dummy metallic pattern 710, the flexibility of the first dummy metallic pattern 710 may be increased. Thus, the first dummy metallic pattern 710 may be prevented from being damaged, and a bending process may be easily performed.

Figure 6:
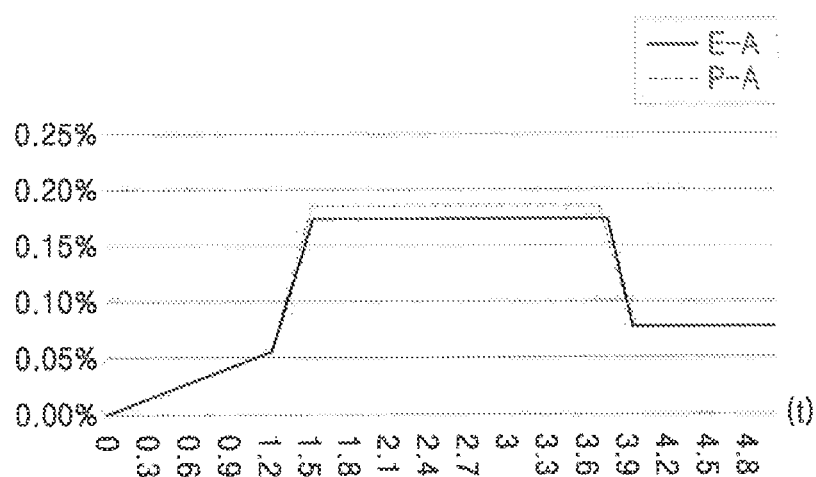
FIG. 6 is a view illustrating a strain of metallic wirings in a bending area at a point A of FIG. 3 depending on the existence of dummy metallic patterns when the display device of FIG. 1 is bent in the bending area.
Figure 7:
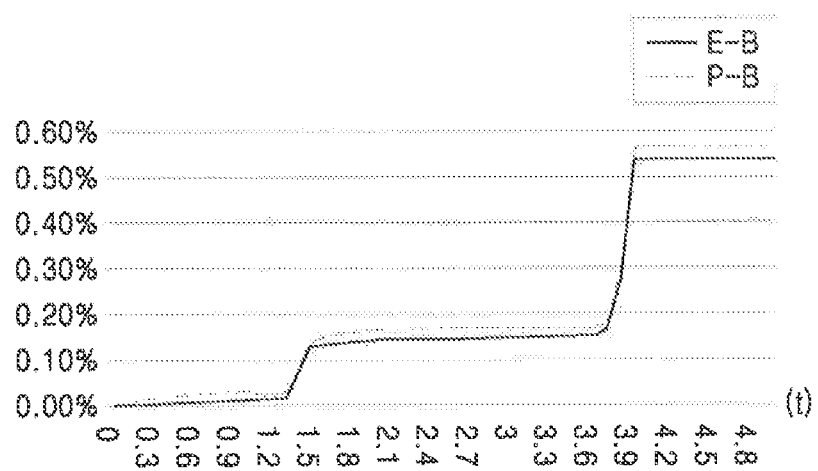
FIG. 7 is a view illustrating a strain of metallic wirings in a bending area at a point B of FIG. 3 depending on the existence of dummy metallic patterns when the display device of FIG. 1 is bent in the bending area.
Figure 8:
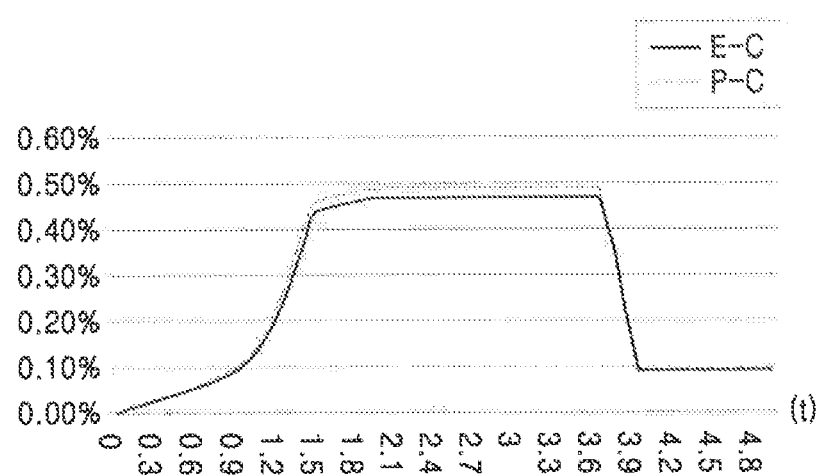
FIG. 8 is a view illustrating a strain of metallic wirings in a bending area at a point C of FIG. 3 depending on the existence of dummy metallic patterns when the display device of FIG. 1 is bent in the bending area.

FIGS. 6 through 8 illustrate strains of metallic wirings in a bending area at points A, B and C of FIG. 3 depending on the existence of dummy metallic patterns when the display device of FIG. 1 is bent in the bending area.

FIG. 6 illustrates strains of metallic wirings in the bending area during bending and after bending is completed, respectively, at a point A of FIG. 3. FIG. 7 illustrates strains of metallic wirings in the bending area during bending and after bending is completed, respectively, at a point B of FIG. 3. FIG. 8 illustrates strains of metallic wirings in the bending area during bending and after bending is completed, respectively, at a point C of FIG. 3. Here, the point A of FIG. 3 is a point adjacent to the bending area (e.g., between the display area DA and the bending area BA), the point B of FIG. 3 is a point at a central area of the bending area, and the point C of FIG. 3 is a point from which bending starts (e.g., between the bending area BA and the pad area PADA and/or an edge of the substrate 110).

In addition, in FIGS. 6 through 8, 'E' represents an exemplary embodiment of the present inventive concept including the first dummy metallic pattern, and 'P' represents a comparative example having no first dummy metallic pattern. In addition, the horizontal axis of FIGS. 6 through 8 represents a time t (seconds) from the instant that bending starts in the bending area to a time when bending is completed. For example, E-A of FIG. 6 represents an exemplary embodiment E which illustrates strains on wirings in the bending area at the point A and after 3.9 seconds, and the wirings in the bending area at the point A are strained by 0.093%.

Table 1 represents maximum stress values during bending and residual stress values after bending is completed in FIGS. 6 through 8.

TABLE 1

| Measurement position | | A | B | C |
|---|---|---|---|---|
| During bending | Exemplary Embodiment (E) | 0.175 (N/mm$^2$) | 0.155 (N/mm$^2$) | 0.464 (N/mm$^2$) |
| | Comparative example (P) | 0.187 (N/mm$^2$) | 0.165 (N/mm$^2$) | 0.486 (N/mm$^2$) |
| After bending is completed | Exemplary Embodiment (E) | 0.076 (N/mm$^2$) | 0.539 (N/mm$^2$) | 0.093 (N/mm$^2$) |
| | Comparative example (P) | 0.078 (N/mm$^2$) | 0.564 (N/mm$^2$) | 0.094 (N/mm$^2$) |

With reference to the above Table 1 and FIGS. 6 through 8, in the case including the first dummy metallic pattern, strains on wiring in the bending area and the amount of stress at all points A, B, and C are reduced compared to the case where no first dummy metallic pattern is present. For example, at the point B that is at a central area of the bending area, the maximum stress value during bending may be reduced by about 6.1% according to an exemplary embodiment of the present inventive concept compared to the comparative example, and even when bending is completed, the maximum stress value may be reduced by about 4.4% according to an exemplary embodiment of the present inventive concept compared to the comparative example. Thus, as the first dummy metallic pattern is positioned between the first organic insulating layer and the second organic insulating layer, stress that may occur in the bending area may be reduced.

Figure 9:
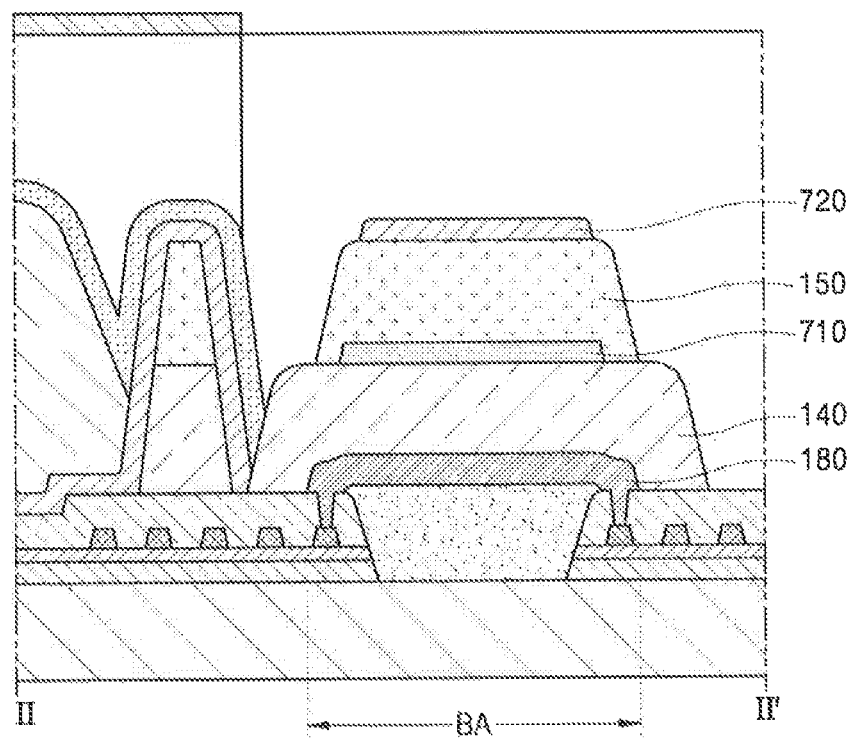
FIG. 9 is a cross-sectional view taken along a line II-II' of FIG. 3 according to an exemplary embodiment of the present inventive concept.
Figure 10:
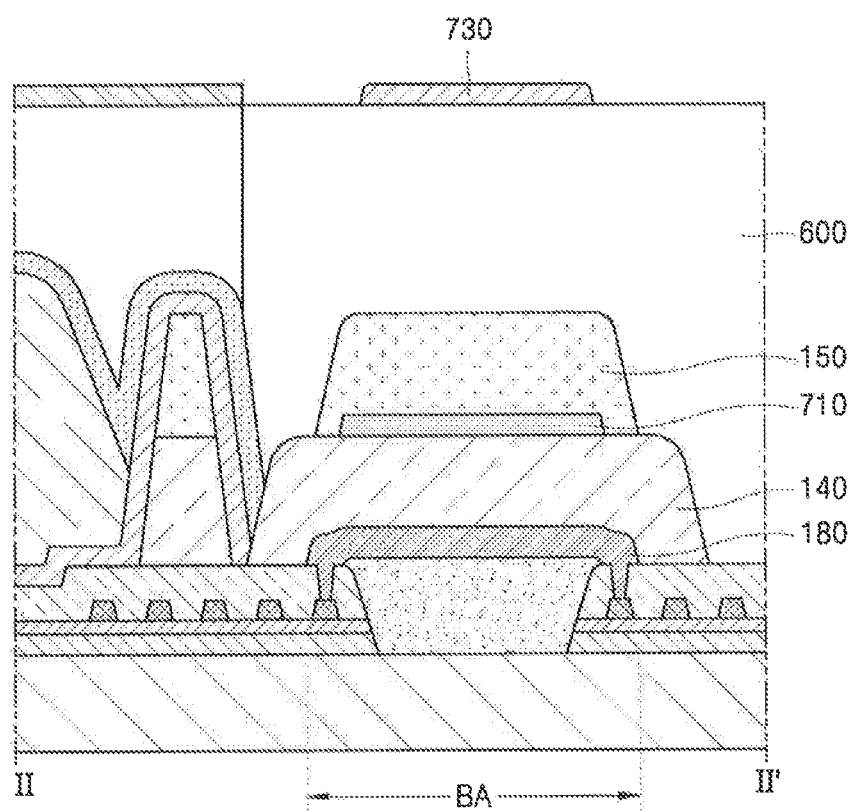
FIG. 10 is a cross-sectional view taken along a line II-II' of FIG. 3 according to an exemplary embodiment of the present inventive concept.

FIG. 9 is a cross-sectional view taken along a line of FIG. 3 according to an exemplary embodiment of the present inventive concept, and FIG. 10 is a cross-sectional view taken along the line II-II' of FIG. 3 according to an exemplary embodiment of the present inventive concept. Hereinafter, only differences from the above descriptions will be described.

Referring to FIG. 9, the display device (see 100 of FIG. 1) may further include, in the bending area BA, a second dummy metallic pattern 720 disposed on the second organic insulating layer 150 in addition to the first dummy metallic pattern 710 disposed between the first organic insulating layer 140 and the second organic insulating layer 150. In an example, the second dummy metallic pattern 720 may include the same material as the second conductive layer of the pixel electrode (see 311 of FIG. 4). In this way, when the second dummy metallic pattern 720 is formed on the second organic insulating layer 150, resistance with respect to the tensile stress in the bending area BA may increase, and in addition to the first dummy metallic pattern 710, the second dummy metallic pattern 720 may further prevent an external shock from being transferred to the metallic wirings 180 in the bending area BA. Thus, the metallic wirings 180 in the bending area BA may be prevented from being damaged.

Referring to FIG. 10, the display device (see 100 of FIG. 1) may further include, in the bending area BA, a third dummy metallic pattern 730 disposed on the bending protection layer 600 in addition to the first dummy metallic pattern 710 disposed between the first organic insulating layer 140 and the second organic insulating layer 150. The third dummy metallic pattern 730 may include Ag having a relatively high tensile strength.

The third dummy metallic pattern 730 is positioned on the bending protection layer 600 and thus may block external shock directly. Thus, the third dummy metallic pattern 730 may prevent the external shock from being transferred to the metallic wirings 180 in the bending area BA.

FIG. 9 illustrates a display device 100, according to an exemplary embodiment of the present inventive concept, further including the second dummy metallic pattern 720. FIG. 10 illustrates a display device 100, according to an exemplary embodiment of the present inventive concept, further including the third dummy metallic pattern 730. However, exemplary embodiments of the present inventive concept are not limited thereto. For example, the second dummy metallic pattern 720 and the third dummy metallic pattern 730 may be formed simultaneously.

According to an exemplary embodiment of the present inventive concept, as first dummy metallic patterns are arranged between a first organic insulating layer and a second organic insulating layer in a bending area of a display device, metallic patterns disposed in the bending area may be prevented from being damaged by shock, etc. It will be understood that the spirit and scope of the present inventive concept is not limited by these effects.

It should be understood that exemplary embodiments of the present inventive concept described herein should be considered in a descriptive sense and not for purposes of limitation.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A display device comprising:
a substrate comprising a display area, a peripheral area, a pad area, and a bending area disposed between the display area and the pad area, wherein the peripheral area is disposed outside the display area, and the pad area is disposed in the peripheral area;
a plurality of metallic wirings positioned on the substrate and in the bending area;
a first organic insulating layer and a second organic insulating layer stacked on the plurality of metallic wirings in the bending area; and
a first dummy metallic pattern disposed between the first organic insulating layer and the second organic insulating layer,
wherein the first dummy metallic pattern overlaps the plurality of metallic wirings and the bending area.

2. The display device of claim 1, wherein a thin-film transistor and a light-emitting device electrically connected to the thin-film transistor are positioned in the display area of the substrate, and the first organic insulating layer is positioned between the thin-film transistor and the light-emitting device in the display area.

3. The display device of claim 2, wherein the thin-film transistor comprises an active layer, a gate electrode, a source electrode, and a drain electrode, and the plurality of metallic wirings comprise a same material as the source electrode and the drain electrode.

4. The display device of claim 2, wherein the light-emitting device comprises a pixel electrode electrically connected to the thin-film transistor, a common electrode disposed on the pixel electrode, and an intermediate layer disposed between the pixel electrode and the common electrode, and wherein the first dummy metallic pattern comprises a same material as the pixel electrode.

5. The display device of claim 4, wherein the pixel electrode has a stack structure including a first conductive layer, a second conductive layer and a third conductive layer, wherein the first conductive layer includes a transparent or semitransparent electrode layer,
wherein the second conductive layer includes silver,
wherein the third conductive layer includes a transparent or semitransparent electrode layer, and
wherein the first dummy metallic pattern comprises a same material as the second conductive layer.

6. The display device of claim 4, wherein, in the display area, the second organic insulating layer comprises an opening covering edges of the pixel electrode and exposing a central portion of the pixel electrode, and wherein the intermediate layer is positioned on the pixel electrode in the opening.

7. The display device of claim 1, further comprising a bending protection layer disposed on the second organic insulating layer, wherein the bending protection layer provides a stress neutral plane, in the bending area, for the plurality of metallic wirings.

8. The display device of claim 7, further comprising a second dummy metallic pattern disposed between the second organic insulating layer and the bending protection layer.

9. The display device of claim 7, further comprising a third dummy metallic pattern disposed on the bending protection layer.

10. The display device of claim 1, wherein the first dummy metallic pattern extends along the bending area and comprises a plurality of holes.

11. The display device of claim 1, wherein an inorganic insulating layer is stacked on the display area and the peripheral area of the substrate, and
the bending area comprises an open area and a dummy insulating pattern including an organic material positioned in the open area, wherein the open area exposes a top surface of the substrate.

12. The display device of claim 11, wherein the plurality of metallic wirings are positioned on the dummy insulating pattern.

13. A display device comprising:
a substrate comprising a display area, a peripheral area, a pad area, and a bending area disposed between the display area and the pad area, wherein the peripheral area is disposed outside the display area, and the pad area is disposed in the peripheral area;
a thin-film transistor disposed in the display area of the substrate;
a light-emitting device electrically connected to the thin-film transistor;
a first organic insulating layer disposed between the thin-film transistor and the light-emitting device;
a second organic insulating layer disposed on the first organic insulating layer and providing an emission area of the light-emitting device;
a plurality of metallic wirings positioned on the substrate and in the bending area disposed between the display area and the pad area; and
a bending protection layer disposed on the second organic insulating layer in the bending area, wherein the bending protection layer provides a stress neutral plane in the bending area,
wherein the first organic insulating layer, the second organic insulating layer, and
the plurality of metallic wirings are stacked in the bending area, and a first dummy metallic pattern is positioned between the first organic insulating layer and the second organic insulating layer, wherein the display device further comprises a second dummy metallic pattern disposed between the second organic insulating layer and the bending protection layer.

14. The display device of claim 13, wherein the first dummy metallic pattern is in a floating state.

15. The display device of claim 13, wherein a first portion of the first organic insulating layer disposed in the bending area is separated from a second portion of the first organic insulating layer disposed in the display area.

16. The display device of claim 13, wherein the first dummy metallic pattern comprises a plurality of holes.

17. The display device of claim 13, wherein the light-emitting device comprises a pixel electrode electrically connected to the thin-film transistor, wherein the pixel electrode has a stack structure including a first conductive layer, a second conductive layer and a third conductive layer, wherein the first conductive layer includes a transparent or semitransparent electrode layer,
wherein the second conductive layer includes silver,
wherein the third conductive layer includes a transparent or semitransparent electrode layer, and
wherein the first dummy metallic pattern comprises a same material as the second conductive layer.

18. The display device of claim 13, further comprising a third dummy metallic pattern disposed on the bending protection layer in the bending area.

* * * * *